United States Patent [19]

Allemann

[11] Patent Number: 4,818,864
[45] Date of Patent: Apr. 4, 1989

[54] METHOD FOR ELIMINATING UNDESIRABLE CHARGED PARTICLES FROM THE MEASURING CELL OF AN ICR SPECTROMETER

[75] Inventor: Martin Allemann, Hinwil, Switzerland

[73] Assignee: Spectrospin AG, Switzerland

[21] Appl. No.: 81,862

[22] Filed: Aug. 5, 1987

[30] Foreign Application Priority Data

Aug. 14, 1986 [DE] Fed. Rep. of Germany ....... 3627605

[51] Int. Cl.$^4$ .............................................. H01J 49/36
[52] U.S. Cl. .................................. 250/291; 250/290; 250/292; 250/293; 250/282
[58] Field of Search ............... 250/291, 282, 290, 293, 250/292

[56] References Cited

U.S. PATENT DOCUMENTS

| | | |
|---|---|---|
| 4,464,520 | 8/1984 | Allemann et al. ................. 250/291 |
| 4,535,235 | 8/1987 | McIver et al. ...................... 250/281 |
| 4,686,365 | 8/1987 | Meek et al. ......................... 250/281 |

OTHER PUBLICATIONS

Huang et al, "Mass-Dependent Z-Excitation of Ions in Cubic Traps Used in Films", Internal Journal of Mass Spectrometry and Ion Processes, 72(1986) pp. 15–31.
Baykut et al, "Fourier Transform Ion Cyclotron Resonance Mass Spectrometry", trends in analytical chemistry, vol. 5, No. 2, Feb. 1986, pp. 44–49.
"Messtechnik 6/70" Karl-Heinz Lebert, Frankfurt: Ionen-Cyclotronresonanz zur Untersuchung Ion-Molekül-Reaktionen, pp. 109 through 115.

Primary Examiner—Carolyn E. Fields
Assistant Examiner—John A. Miller
Attorney, Agent, or Firm—Walter A. Hackler

[57] ABSTRACT

For eliminating undesirable charged low-mass particles from the measuring cell of an ion cyclotron resonance spectrometer the electrodes normally required for exciting the cyclotron movement are supplied with an rf voltage having a frequency twice as high as the resonance frequency of the trapping oscillation of the charged particles between the trapping electrodes provided perpendicularly to the homogenous magnetic field of the spectrometer. In this manner, the low-mass charged particles are excited to perform trapping oscillations in the direction of the homogenous magnetic field which cause the charged particles to overcome the trapping potentials and, thus, to be eliminated.

4 Claims, 2 Drawing Sheets

METHOD FOR ELIMINATING UNDESIRABLE CHARGED PARTICLES FROM THE MEASURING CELL OF AN ICR SPECTROMETER

BACKGROUND OF THE INVENTION

The present invention relates to a method for eliminating undesirable charged low-mass particles from the measuring cell of an ion cyclotron resonance spectrometer, the measuring cell being arranged within a homogeneous magnetic field and defined by trapping electrodes which are provided in perpendicular arrangement relative to the direction of the magnetic field and maintained at a trapping potential generating a trapping field for the charged particles, and by transmitting electrodes provided in parallel arrangement relative to the direction of the magnetic field and supplied with an rf voltage serving to excite the cyclotron movement, the said method including the step of exciting the charged particles to be eliminated by modulation of the trapping field, to perform trapping oscillations in the direction of the homogenous magnetic field so that they overcome the trapping potentials and reach the trapping electrodes for being eliminated via the trapping electrodes.

The elimination of low-mass charged particles from the measuring cells of ion cyclotron resonance or, shortly, ICR spectrometers is of great importance in quite a number of experiments. For example, the elimination of He+ ions is very important in gas chromatography experiments with a view to improving the dynamic range of the instrument. A great number of He+ ions originating from the carrier gas lead to considerable space-charge effects which impair the effectiveness of the ion trap if no measures are taken to remove the He+ ions before signal detection occurs. Similarly, when working with negative ions, trapped electrons may impair the experiments in an undesirable manner. Consequently, it is an important aspect of high-power ICR spectrometers that they provide the possibility of eliminating such low-mass particles.

However, eliminating these particles cannot easily be effected with the aid of the usual double-resonance technique because the cyclotron resonance frequencies of such light-weight particles are very high. Given a strength of the homogenous magnetic field of 4.7 Tesla, the cyclotron resonance frequency of electrons is in the range of approximately 140 GHz. Such a high frequency is far beyond the frequency range of the electronic equipment of usual ICR spectrometers. So, it has been known for example from "messtechnik" 78 (6, 1970), 109 to 195, to eliminate such light-weight particles by utilization of the harmonic oscillations performed by these particles along the magnetic field line, i.e. the so-called trapping oscillation. From a paper by McIver et al published in "Lecture notes in chemistry", (1982), pages 164 to 182, it has also been known to connect an oscillator to the trapping electrodes which provides the possibility of exciting electrons to perform trapping oscillations in the direction of the magnetic field until they get into contact with the trapping electrode and are, thus, eliminated. However, it is a drawback of this method that it requires the use of an additional, tunable transmitter since the resonance frequency of the trapping oscillations depends not only on the charge/mass ratio of the particles to be eliminated, but also on the potential applied to the trapping electrodes.

SUMMARY OF THE INVENTION

Now, it is the object of the present invention to provide a method which can be carried out without the use of an additional, electronically tunable oscillator.

According to the present invention, this object is achieved by a method which provides that modulation of the trapping field is effected by supplying an rf voltage to the transmitting electrodes.

It has been found that due to the unavoidable inhomogeneities of the rf field, which is generated by applying an rf voltage to the transmitting electrodes, the said field also contains a component extending in the direction of the homogenous magnetic field and, thus, also in the direction of the trapping field, which component is sufficient to excite low-mass charged particles to perform trapping oscillations in the direction of the homogenous magnetic field and to increase thereby the energy of these charged particles so as to permit them to overcome the trapping potentials. A particularly good effect is achieved in this case by application of an rf voltage having a frequency twice as high as the resonance frequency of the trapping oscillations of the charged particles to be eliminated.

The advantage of the method according to the invention lies in the fact that it does not require any additional equipment but can be carried out with the aid of the rf transmitter anyway required in usual double-resonance experiments for eliminating charged particles and exciting them with the cyclotron resonance frequency.

The method according to the invention is based on the theory that the charged particles move in ICR measuring cells under the influence of inhomogenous magnetic fields and a homogenous magnetic field. Accordingly, the movement of the charged particles is, therefore, made up of superimposed cyclotron and drift movements in a plane perpendicular to the magnetic field, and a trapping oscillation of a frequency $\omega_T$ along the magnetic field. The frequency of the trapping oscillation of a charged particle in a cylindrical ICR measuring cell is determined by $$\omega_T = \left( \frac{qV_T S_{T2}^{\circ} 4}{mR^2} \right)^{\frac{1}{2}} = \left( \frac{4qV_T S_{T2}^{\circ}}{mR^2} \right)^{\frac{1}{2}} \quad (1)$$

In formula (1) m is the mass of the particle, q is its charge and $V_T$ is the difference in potential between the trapping electrodes and the side electrodes. R is the radius of the measuring cell, and $S_{T2}^{\circ}$ is a geometry factor.

It is generally known that the trapping oscillation can be excited by applying to the trapping electrode an rf voltage of the frequency resulting from formula (1). The cyclotron movement of the charged particles normally utilized for determining the mass/charge ratio is usually excited by an rf pulse applied to the transmitting electrodes and by a pulse of equal amplitude which is dephased by 180° and applied to the opposite transmitting electrode. The rf field thus generated comprises a component in the direction of the Z axis coinciding with the direction of the homogenous magnetic field, in both cylindrical and cubic measuring cells. In a cylindrical measuring cell, the force exerted by this component upon a particle having a charge q is determined by the formula $$F_z = \frac{qV_E S^1_{E3} 4}{R^3} XZ; \quad V_E = V_E° \cos \omega t. \tag{2}$$

In these formulas, $V_E$ is the amplitude of the rf voltage, $S^1_{E3}$ is a geometry factor, and R is the radius of the measuring cell.

It can be shown by simple conversions of these formulas how the electric field can be utilized for exciting the trapping oscillation of charged particles and electrons. It is supposed for this purpose that the application of the rf pulse disturbs slightly the stationary condition of the charged particles in the ICR measuring cell. In addition, it is supposed that the time during which the rf voltage is applied to the transmitting electrodes of the measuring cell is much longer than the cycle of a trapping oscillation. The energy exchange is then determined by the formula $$dE/dt = \vec{F}\vec{v}; \Delta E = \int_0^T \vec{F}\vec{v} dt. \tag{3}$$

In these formulas, F is the force exerted upon the particle and v is the speed.

It is further assumed that the movements in the Z direction and in the X, Y plane are not coupled so that the calculations can be restricted to the movements in the Z direction. Hereafter, the mean growth in energy experienced by the particles under the effect of the rf field will be calculated. By combining formula (2) and (3), one arrives at $$\Delta E = \frac{qV_E° S_{E3} 4K}{R^3} \int_0^T \cos\omega t \, zzdt; \quad C = \frac{qV_E° S_{E3} 4K}{R^3}. \tag{4}$$

The trapping oscillation is described approximately by the formula $$Z(\tau) = Z_0 \cos(\omega_z t + \phi). \tag{5}$$

By combining formulas (4) and (5), and after some trigonometric conversions, one arrives at $$\Delta E = -\frac{1}{2} C Z_0^2 \omega_t \int_0^T \cos\omega t \sin(2\omega_t t + 2\phi) dt. \tag{6}$$

After another trigonometric conversion, and omission of the periodic term, one arrives at $$\Delta E = \frac{1}{4} C_0^2 \omega_t \frac{\cos\{(2\omega_t - \omega) + 2\phi\}}{2\omega_t - \omega} \int_0^T. \tag{7}$$

A notable mean growth in energy will occur only if $\omega = 2.\omega_T$. Based on this condition, one finally arrives at $$\Delta E = -\frac{1}{4} C Z_0^2 \omega_t \tau \sin 2\phi. \tag{8}$$

If charged particles are to be removed from a measuring cell in the Z direction, the growth in energy $\Delta E$ must be at least as important as the value of the trapping potentials $qV_T$.

This simple calculation predicts that the greatest growth in energy in the Z direction is obtained when the frequency of the applied energy is twice as high as the frequency of the trapping oscillation of the particles to be eliminated.

BRIEF DESCRIPTION OF THE DRAWINGS

The invention will now be described and explained in greater detail with reference to a number of experiments and related diagrams shown in the drawing. The features that can be derived from the following specification and the drawing may be used in other embodiments of the method according to the invention either individually or in any combination thereof. In the drawings

DETAILED DESCRIPTION OF THE INVENTION

Figure 1:
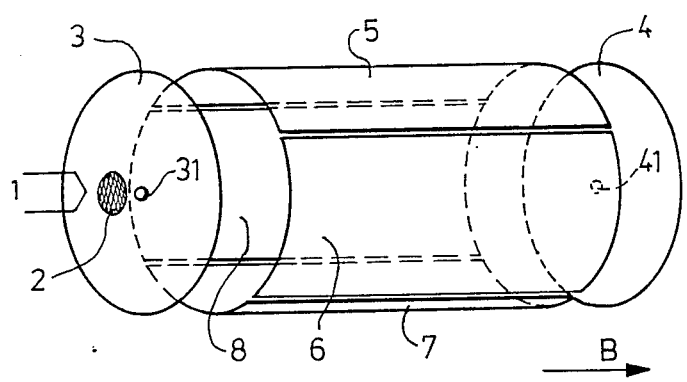
FIG. 1 shows a diagrammatic representation of the measuring cell of an ion cyclotron resonance spectrometer.

The experiments described hereafter were carried out using an ICR spectrometer make Spectrospin AG, Model CMS 47, which was equipped for Fourier transformation. The spectrometer comprised a superconductive magent with a measuring chamber of 150 mm diameter exposed to ambient temperature. The field strength prevailing in the measuring chamber was 4.7 Tesla. The measuring chamber contained a measuring cell of the structure shown in FIG. 1. Two trapping electrodes 3, 4 provided with small central holes 31, 41 for being passed by an electron beam which can be generated by a hot cathode 1 and an accelerator grid 2, are provided vertically to the direction of the magnetic field B generated by the superconductive magnet, in spaced relation in the direction of the magnetic field. The space delimited by the two trapping electrodes is surrounded by four additional electrodes 5 to 8 forming each a sector of a circular cylinder. The one pair of oppositely arranged electrodes forms transmitting electrodes, 6, 8 to which an rf transmitter was connected in the usual manner, while the other pair forms receiving electrodes 5, 7 to which the receiver was connected in the usual manner. Likewise, trapping potentials could by applied to the trapping electrodes 3, 4 in the usual manner. The spectrometer was additionally provided with means for measuring small masses and was, accordingly, capable of measuring charge/mass ratios of 2 to 3500. The instrument thus made it possible to measure $He^+$ ions and to determine without any doubt whether or not the $He^+$ ions could be eliminated by exciting their trapping oscillation.

The experiments carried out demonstrated very clearly that the trapping oscillation of charged particles can be excited by supplying rf pulses to the transmitting electrodes of the ICR measuring cell.

Figure 2:
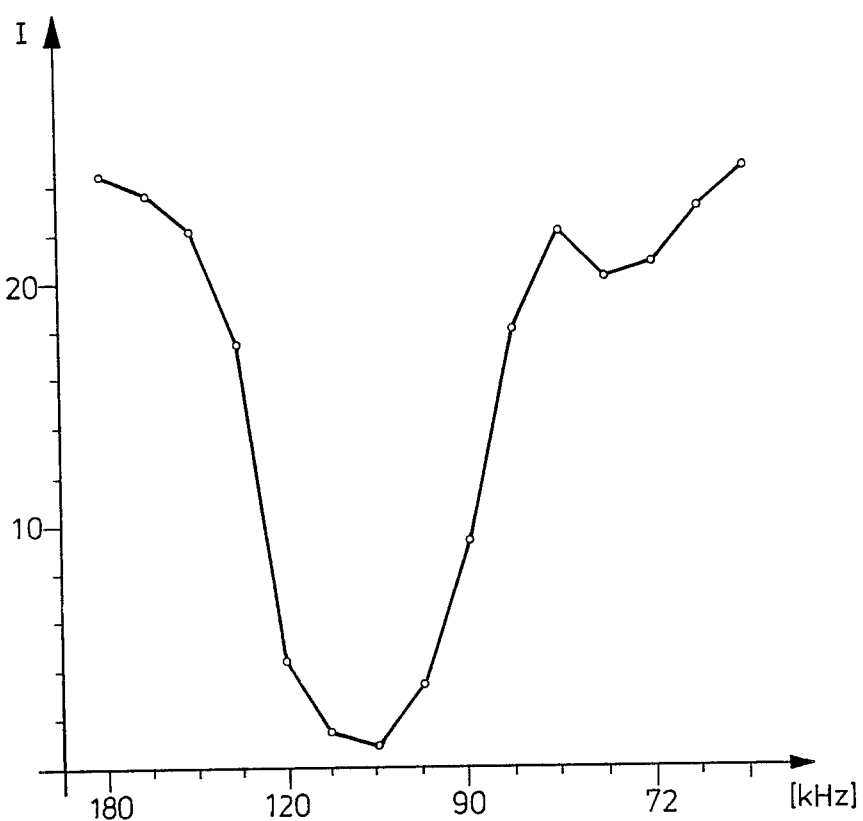
FIG. 2 shows a diagram of the intensity of $He^+$ ions as a function of the applied resonance frequency.

As appears from FIG. 2, the intensity of the $He^+$ ions, being a function of the applied frequency, assumes a minimum at 106 KHz when most of the $He^+$ ions have been eliminated from the measuring cell. The pulses used for this experiment were rf pulses with an amplitude of 12 V and a duration of 100 $\mu$s. The frequency of 106 KHz, at which the minimum of $He^+$ intensity is encountered, corresponds approximately to twice the resonance frequency of the trapping oscillation and conforms rather exactly to the theoretical value which was determined to be 116 KHz.

Figure 3:
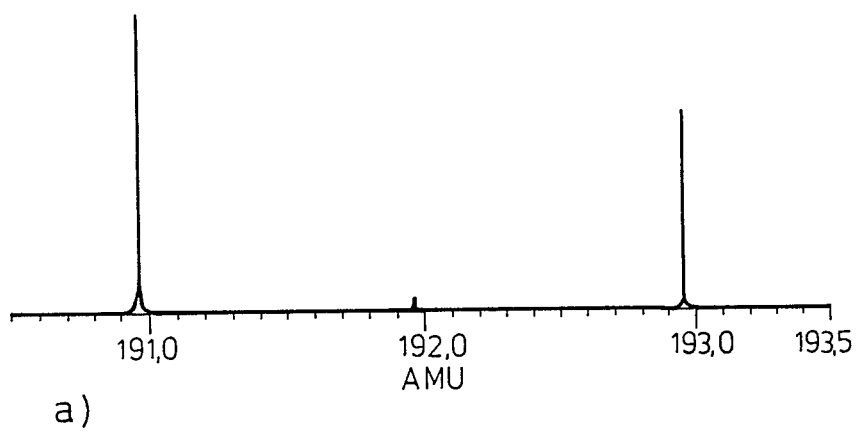
FIG. 3 shows ICR spectra after and without elimination of electrons, respectively.
Figure 3:
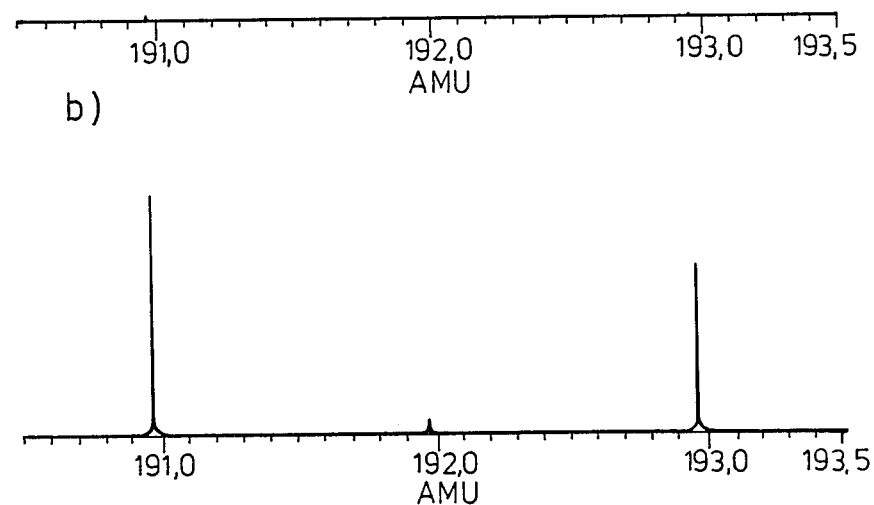

FIG. 3 illustrates the usefulness of the method according to the invention for eliminating electrons. The measurements were performed for this purpose on the ICR spectra of negatively ionized 1,2-dichlor-4-nitrobenzene. For ionizing the 1,2-dichlor-4-nitrobenzene, an electron beam pulse was used. Following this electron beam pulse, a certain reaction time is required until a sufficient number of negative ions have formed so that ions can be detected. It can be assumed that during the reaction time electrons trapped in the measuring cell are trapped by the neutral molecules of the sample whereby negative ions are formed. When an rf pulse of a frequency having twice the value of the calculated resonance frequency of the trapping oscillation of electrons is applied before the reaction time, the signal disappears almost completely, as shown in FIG. 3b. This disappearance of the signal indicates that the electrons have been eliminated from the cell before they could react with the molecules of the sample. When the same rf pulse is applied after the reaction time, the signal has almost the same intensity as if no pulse had been applied at all because the negative ions already formed are no longer influenced by the rf pulse (FIG. 3c).

The time required for eliminating the light-weight charged particles and the intensity of the applied signal are only slightly less than in the case of double-resonance experiments although much less energy should be required for lifting the charged particles above the trapping potential (a few eV) than would be necessary to cause them to collide with the transmitting electrodes (a few KeV). However, the components of the rf field near the Z axis where most of the charged particles are generated have only little strength so that the excitation process cannot be as effective for the trapping oscillation as for the cyclotron oscillations. Right on the Z axis, the Z component of the rf field is equal to zero so that it is not possible with the method described herein to eliminate any charged particles found very near the Z axis.

The method according to the invention makes use of the electronic means of an ICR spectrometer which are anyway available, and does not require a special oscillator connected to one of the trapping electrodes. In the case of the before-mentioned mass spectrometer, Model CMS 47, the generation of the rf signals is fully controlled by a computer so that the frequency of the rf signals for exciting trapping oscillations which cause different low-mass particles, such as electrons, He+ ions, etc., to be eliminated can be effected automatically. This simplifies largely the process of determining the frequency optimally suited for eliminating the particles by means of the trapping oscillation, and this the more as the resonance is very broad and the electronic means of the spectrometer are capable of covering the whole frequency range of interest for the elimination of particles.

It is of course a general problem in the elimination of charged particles by means of the method according to the invention that ions of greater mass may be disturbed or even eliminated, too, when the applied rf signal is identical to the cyclotron frequency of these ions. If electrons are to be eliminated from the cylindrical measuring cell used in the present case, a frequency of approximately 6 MHz must be introduced for exciting the trapping oscillation of electrons. This frequency is identical to the cyclotron frequency of ions having a mass/charge ratio of 12, at a field strength of 4.7 T. This mass is normally of minor importance in ICR experiments.

As mentioned before, when gas chromatography and mass spectrometry are combined, one is normally interested in eliminating He+ ions. The frequency required for eliminating He+ ions by means of the trapping oscillation is in the range of 20 KHz. This frequency corresponds to the cyclotron movement of ions of 3500 amu. When such ions are eliminated by simultaneous excitation of their cyclotron frequency, this normally does not lead to any problems because such high-mass ions can anyway not be examined by means of gas chromatography.

It goes without saying that the examples discussed before are meant only to explain the invention and that the details of the method according to the invention, in particular the frequencies and signal amplitudes to be applied and also the duration of the application of the signal, are dependent not only on the parameters of the instruments used, but also on the substances to be examined and the quantity of charged particles encountered and to be eliminated.

I claim:

1. A method for eliminating undesirable charged low-mass particles from the measuring cell of an ion cyclotron resonance spectrometer, the measuring cell being within a homogeneous magnetic field and defined by trapping electrodes which are provided in perpendicular arrangement relative to the direction of the magnetic field and maintained at a trapping potential for generating a trapping field for the undesirable charged low-mass particles, and by transmitting electrodes provided in parallel arrangement relative to the direction of the magnetic field and supplied with a first rf voltage serving to excite the cyclotron movement of desired particles within the measuring cell, said method including the step of exciting the undesirable charged low-mass particles, to be eliminated, by modulation of the trapping field, into trapping oscillations in the direction of the homogeneous magnetic field so that they overcome the trapping potentials and reach the trapping electrodes and are eliminated therein, said modulation of the trapping field being effected by supplying a second rf voltage to said transmitting electrodes, said second rf voltage having a frequency substantially less than the cyclotron resonance frequency of the undesirable charged low-mass particles.

2. The method according to claim 1, wherein the transmitting electrodes are supplied with said second rf voltage having a frequency twice as high as the resonance frequency of the trapping oscillation of the undesirable charged low-mass particles to be eliminated.

3. A method for eliminating undesirable charged low-mass particles from the measuring cell of an ion cyclotron resonance spectrometer, the measuring cell being within a homogeneous magnetic field and defined by trapping electrodes and transmitting electrodes, said trapping electrodes being disposed in a perpendicular relationship with the direction of the magnetic field and maintained at a trapping potential for generating a trapping field for undesirable charged low-mass particles, said transmitting electrodes being disposed in a parallel relationship with the direction of the magnetic field and supplied with a first rf voltage causing excitation of cyclotron movement of desired particles within the measuring cell, said method comprising the step of applying a second rf voltage, having a frequency substantially less than the cyclotron resonance frequency of the undesirable charged low-mass particles, to the transmitting electrodes, said second rf voltage having a frequency causing modulation of the trapping field in order to excite the undesirable charged low-mass particles into trapping oscillations in the direction of the homogeneous magnetic field so that the undesirable charged low-mass particles overcome the trapping potential and are eliminated upon reaching the trapping electrodes.

4. The method according to claim 3, wherein the second rf voltage has a frequency twice the frequency of the trapping oscillation of the undesirable charged low-mass particles.

* * * * *